United States Patent
Togo et al.

(10) Patent No.: US 7,355,256 B2
(45) Date of Patent: Apr. 8, 2008

(54) MOS DEVICES WITH DIFFERENT GATE LENGTHS AND DIFFERENT GATE POLYSILICON GRAIN SIZES

(75) Inventors: Mitsuhiro Togo, Kanagawa (JP); Eiji Hasegawa, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/401,292

(22) Filed: Apr. 11, 2006

(65) Prior Publication Data

US 2006/0226454 A1 Oct. 12, 2006

(30) Foreign Application Priority Data

Apr. 11, 2005 (JP) ............... 2005-113985

(51) Int. Cl.
*H01L 29/78* (2006.01)
(52) U.S. Cl. ............... 257/391; 257/E21.637; 257/E21.638; 257/392; 257/500; 438/275
(58) Field of Classification Search ............... 257/296, 257/E21.637, 500, 391, 392
See application file for complete search history.

(56) References Cited

U.S. PATENT DOCUMENTS

| | | | | |
|---|---|---|---|---|
| 5,563,093 A * | 10/1996 | Koda et al. | ............... | 438/231 |
| 6,614,064 B1 * | 9/2003 | Besser et al. | ............... | 257/213 |
| 7,067,382 B2 * | 6/2006 | Nakaoka et al. | ............... | 438/301 |
| 7,119,412 B2 * | 10/2006 | Yamamoto | ............... | 257/500 |
| 7,122,849 B2 * | 10/2006 | Doris et al. | ............... | 257/288 |
| 2002/0155665 A1 * | 10/2002 | Doris et al. | ............... | 438/279 |
| 2004/0238898 A1 * | 12/2004 | Ohgishi | ............... | 257/379 |
| 2005/0236671 A1 * | 10/2005 | Schuele et al. | ............... | 257/347 |
| 2006/0065934 A1 * | 3/2006 | Okayama et al. | ............... | 257/365 |
| 2006/0197120 A1 * | 9/2006 | Surdeanu et al. | ............... | 257/288 |
| 2006/0228885 A1 * | 10/2006 | Saito | ............... | 438/650 |
| 2006/0283380 A1 * | 12/2006 | Lee et al. | ............... | 117/89 |
| 2007/0057331 A1 * | 3/2007 | Satou et al. | ............... | 257/384 |

FOREIGN PATENT DOCUMENTS

JP 2004-356520 12/2004

* cited by examiner

*Primary Examiner*—Jerome Jackson
*Assistant Examiner*—Paul Budd
(74) *Attorney, Agent, or Firm*—Young & Thompson

(57) ABSTRACT

A semiconductor device 1 according to the present invention includes a semiconductor substrate 5, a first transistor 10 which is formed on the semiconductor substrate 5 and includes a first gate electrode portion 16 constituted by a first gate insulating film 24 and a first gate electrode 26 having a first gate length L1 which are stacked, and a second transistor 12 which is formed on the semiconductor substrate 5 and includes a second gate electrode portion 20 constituted by a second gate insulating film 32 and a second gate electrode 30 having a second gate length L2 smaller than the first gate length L1, the second gate insulating film 32 and the second gate electrode 30 being stacked, wherein the grain size of poly-silicon grains forming the first gate electrode 26 is greater than the grain size of poly-silicon grains forming the second gate electrode 30.

9 Claims, 11 Drawing Sheets

PRIOR ART

FIG. 10A
FIG. 10B
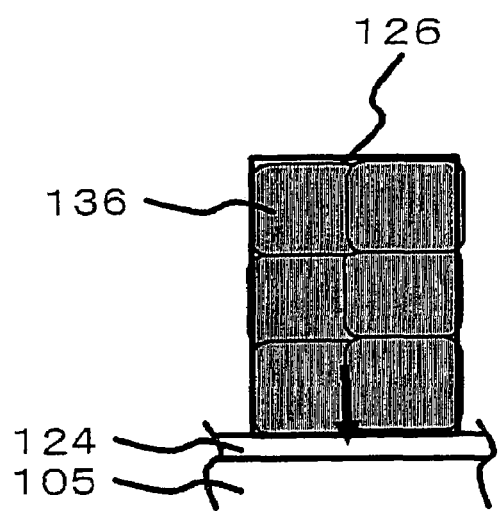
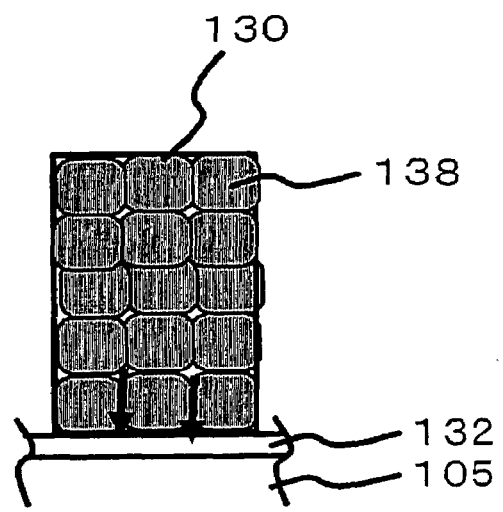
PRIOR ART
PRIOR ART

PRIOR ART

US 7,355,256 B2

MOS DEVICES WITH DIFFERENT GATE LENGTHS AND DIFFERENT GATE POLYSILICON GRAIN SIZES

This application is based on Japanese Patent application NO. 2005-113985, the content of which is incorporated hereinto by reference.

BACKGROUND

1. Technical Field

The present invention relates to a semiconductor device including plural transistors having different gate lengths.

2. Related Art

There is a conventional semiconductor device as disclosed in, for example, Japanese Laid-open patent publication NO. 2004-356520. FIG. 9 illustrates a semiconductor device described in the same literature. The semiconductor device 100 includes a first transistor 110 and a second transistor 112 on a semiconductor substrate 105. The first transistor 110 includes a first gate electrode portion 116 constituted by a first gate insulating film 124 and a first gate electrode 126 which are stacked in this order. The second transistor 112 includes a second gate electrode portion 120 constituted by a second gate insulating film 132 and a second gate electrode 130 which are stacked in this order. A device isolation layer 114 is formed in the semiconductor substrate 105 between the first transistor 110 and the second transistor 112. The first transistor 110 and the second transistor 112 respectively include a pair of impurity diffusion layers 118 and 122 formed at the surface layer of the semiconductor substrate 105. Side walls 128 and 134 are formed on the sidewalls of the first and second gate electrodes 126 and 130, respectively.

FIGS. 10A and 10B illustrate schematic cross-sectional views of the first gate electrode portion 126 and the second gate electrode portion 130. Further, the side walls 128 and 134 are not illustrated therein. In the semiconductor device 100, the grain size of the poly-silicon grains 136 forming the first gate electrode 126 is adjusted to be greater than the grain size of the poly-silicon grains 138 forming the second gate electrode 130. The first gate electrode 126 and the second gate electrode 130 are formed by diffusing impurities into the grain boundaries of the poly-silicon grains.

SUMMARY OF THE INVENTION

However, the conventional technique described in the aforementioned literature leaves room for improvement in the following points.

As illustrated in FIG. 10A, when the gate length is small relative to the grain size of the poly-silicon grains, there are a small number of impurity diffusion paths within the first gate electrode 126. Accordingly, there is partial absence of impurity diffusion paths within the first gate electrode 126 or there are variations of the number of impurity diffusion paths therein. This induces variations of the impurity diffusion concentration in the first gate electrode 126, which causes depletion therein, thus resulting in degradation of the electrical characteristics of the first transistor 110.

Under the aforementioned circumstance, there has been a need for semiconductor devices capable of suppressing the depletion in the gate electrodes constituting transistors, thereby stabilizing the electric characteristics of the transistors.

According to the present invention, there is provided a semiconductor device including a semiconductor substrate, a first transistor which is formed on the semiconductor substrate and includes a first gate electrode portion constituted by a first gate insulating film and a first gate electrode having a first gate length which are stacked in this order, and a second transistor which is formed on the semiconductor substrate and includes a second gate electrode portion constituted by a second gate insulating film and a second gate electrode having a second gate length smaller than the first gate length, the second gate insulating film and the second gate electrode being stacked in this order, wherein the grain size of poly-silicon grains forming the first gate electrode is greater than the grain size of poly-silicon grains forming the second gate electrode.

According to the present invention, it is possible to suppress the depletion in the gate electrodes constituting the transistors, which can stabilize the electrical characteristics of the transistors, thereby realizing a reliable semiconductor device. The semiconductor device including the aforementioned gate electrodes can be fabricated by employing predetermine annealing conditions as in examples which will be described later.

The term "grain size" of poly-silicon grains in the present invention means the number average of grain size of poly-silicon grains in across section of the gate electrode observed with an electron microscope.

In the semiconductor device according to the present invention, the grain size of the poly-silicon grains forming the first gate electrode is greater than the grain size of the poly-silicon grains forming the second gate electrode. Further, the second gate length of the second gate electrode is smaller than the first gate length of the first gate electrode. Therefore, in a plurality of transistors including such gate electrodes, the depletion in the gate electrodes constituting the transistors can be suppressed, which can stabilize the electric characteristics of the transistors, thereby offering a reliable semiconductor device.

BRIEF DESCRIPTION OF THE DRAWINGS

The above and other objects, advantages and features of the present invention will be more apparent from the following description taken in conjunction with the accompanying drawings, in which:

FIGS. 10A and 10B are schematic cross-sectional views of a first gate electrode and a second gate electrode in a conventional semiconductor device.

DETAILED DESCRIPTION

Figure 1:
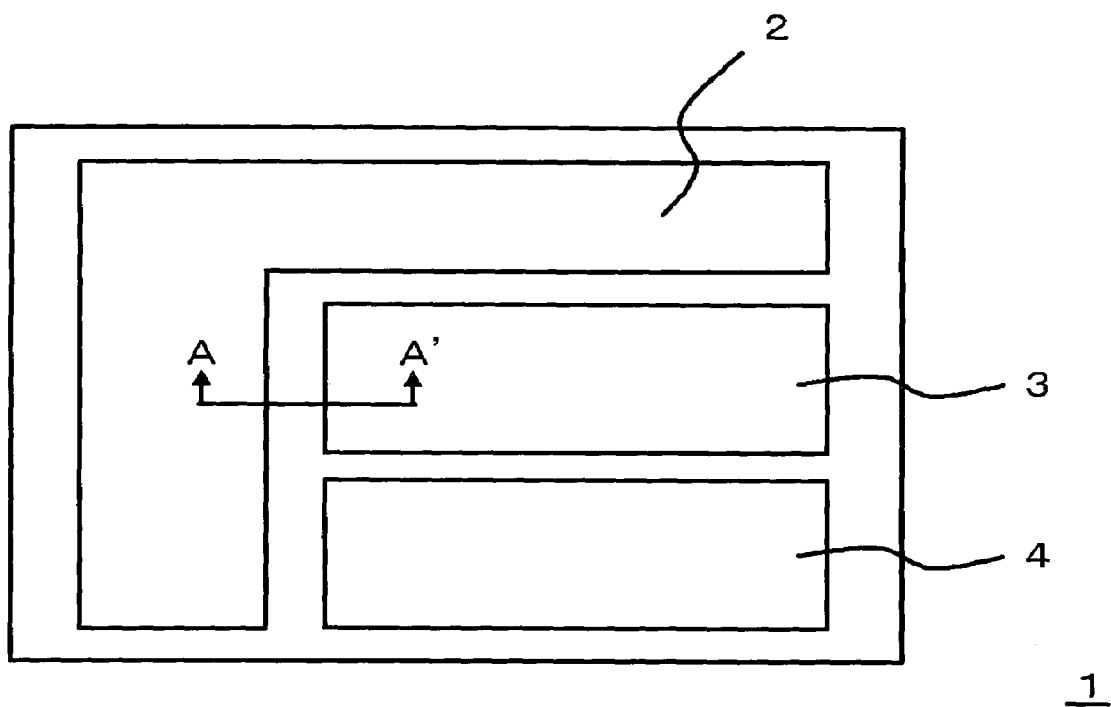
FIG. 1 is a top view schematically illustrating a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an embodiment of the present invention will be described with reference to the drawings. In all the drawings, same reference numerals indicate same components and description thereof will not be appropriately repeated.

FIG. 1 illustrates a top view of a semiconductor device 1 according to the present embodiment. The semiconductor device 1 includes an analog circuit 2 and digital circuits 3 and 4 on a semiconductor substrate. The analog circuit 2 is formed to include a device region including a first transistor and the digital circuits 3 and 4 are formed to include device regions, one of which includes a second transistor. Further, in the present embodiment, there will be described a case where the digital circuit 3 includes a device region including a second transistor.

Figure 2:
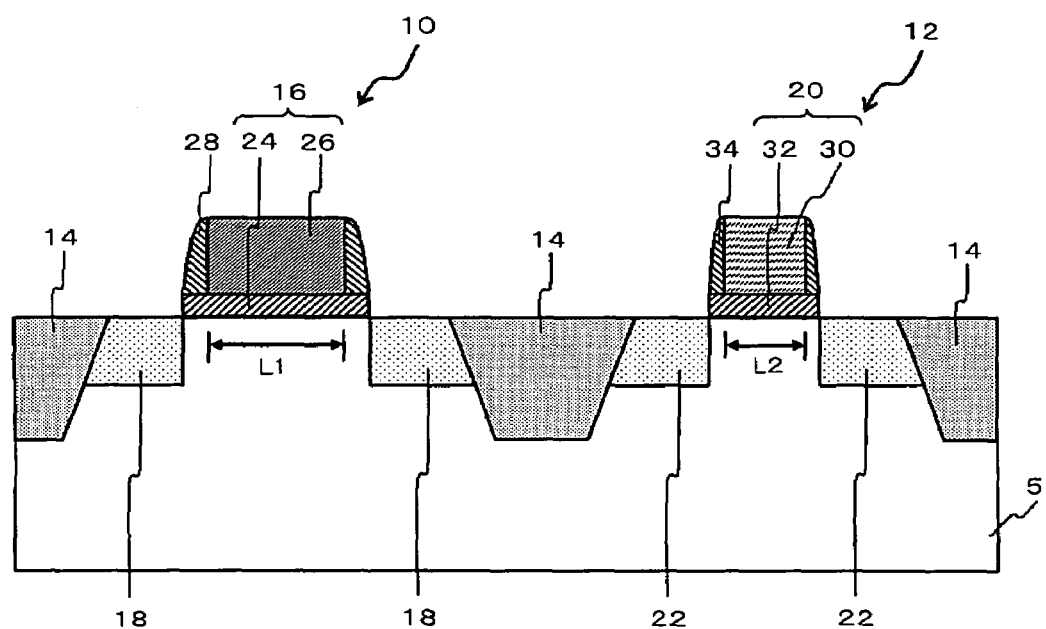
FIG. 2 is a cross-sectional view of the semiconductor device taken along the line A-A' according to the embodiment.
Figure 3:
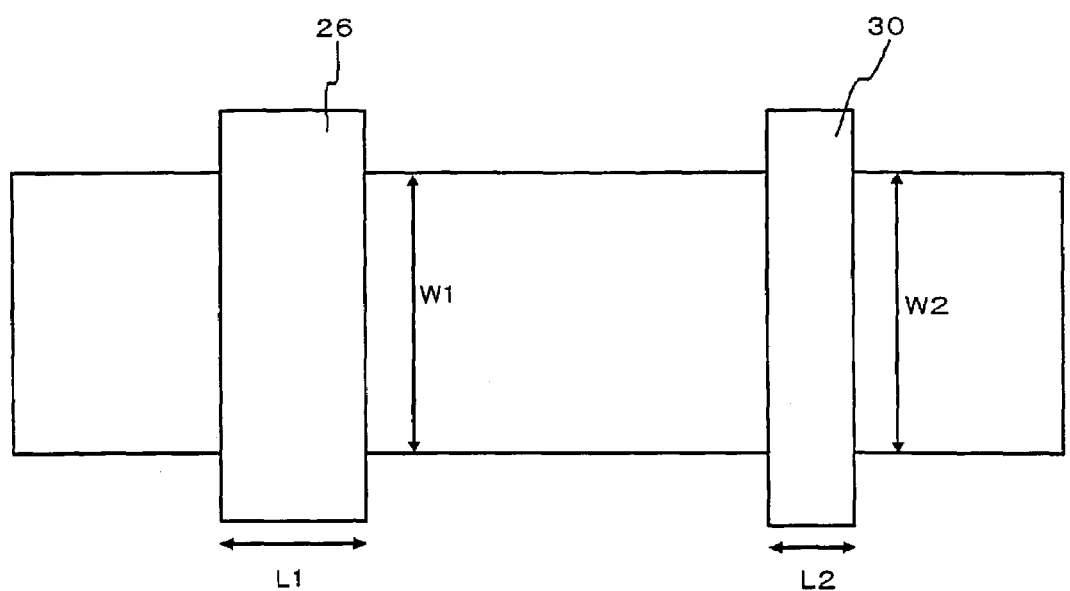
FIG. 3 is a main-part top view of the semiconductor device 1 illustrated in FIG. 2.

FIG. 2 illustrates a cross-sectional view of the semiconductor device 1 illustrated in FIG. 1, taken along the line A-A'. FIG. 3 illustrates a main-part top view of the semiconductor device 1 illustrated in FIG. 2.

As illustrated in FIG. 2, the semiconductor device 1 includes a first transistor 10 and a second transistor 12 on a semiconductor substrate 5. The first transistor 10 includes a first gate electrode portion 16 constituted by a first gate insulating film 24 and a first gate electrode 26 which are stacked in this order. The second transistor 12 includes a second gate electrode portion 20 constituted by a second gate insulating film 32 and a second gate electrode 30 which are stacked in this order. A device isolation layer 14 is formed in the semiconductor substrate 5 between the first transistor 10 and the second transistor 12. The first transistor 10 and the second transistor 12 respectively include a pair of impurity diffusion layers 18 and 22 formed at the surface layer of the semiconductor substrate 5. Side walls 28 and 34 are formed on the sidewalls of the first and second gate electrodes, respectively. The first gate length L1 of the first gate electrode 26 is made greater than the second gate length L2 of the second gate electrode 30.

Figure 4A:
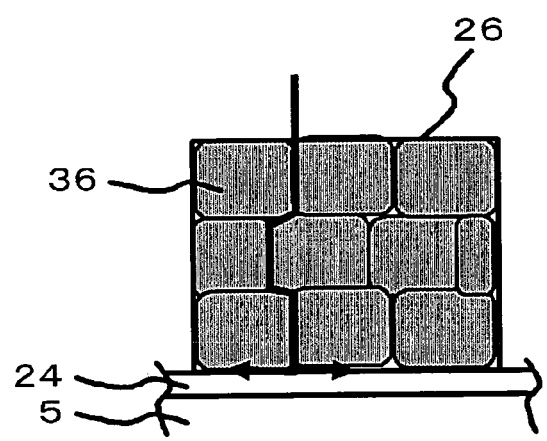
FIGS. 4A and 4B are schematic cross-sectional views of the first gate electrode and the second gate electrode in the semiconductor device according to the embodiment.
Figure 4B:
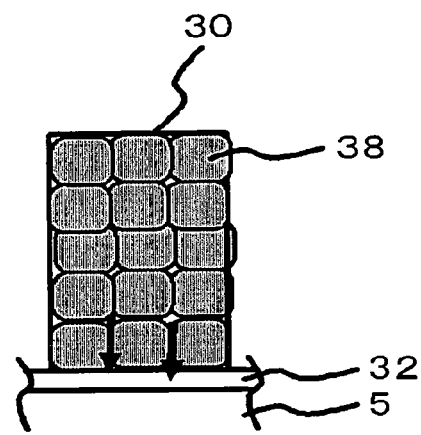

FIGS. 4A and 4B illustrate schematic cross-sectional views of the first gate electrode 26 and the second gate electrode 30 formed on the semiconductor substrate 5. Arrows in the figure indicate the directions of diffusion of impurities. Further, the side walls and the like are not illustrated therein. As illustrated in FIGS. 4A and 4B, the grain size of the poly-silicon grains 36 forming the first gate electrode 26 is greater than the grain size of the poly-silicon grains 38 forming the second gate electrode 30.

As described above, the gate electrodes are made of poly-silicon grains having different grain sizes, wherein the grain sizes are varied depending on the gate lengths of the gate electrodes. This can prevent the depletion in the gate electrodes, thereby stabilizing the electrical characteristics of the transistors.

Figure 11:
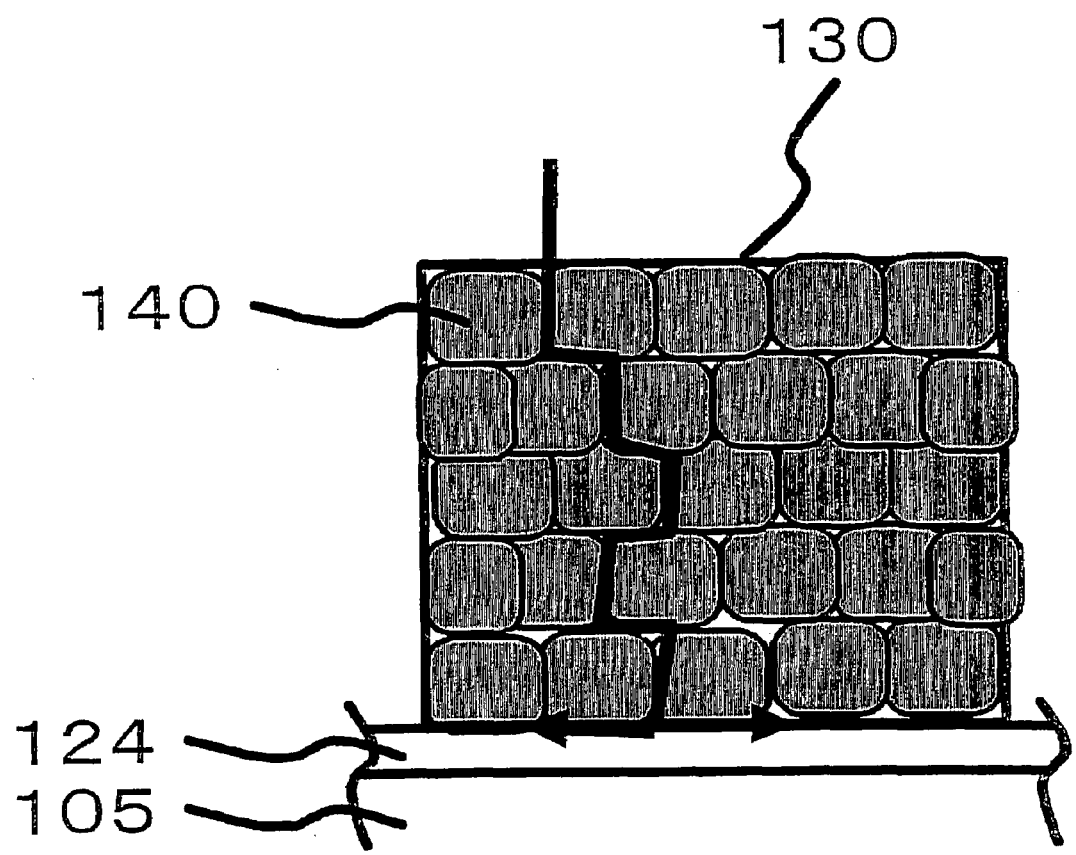
FIG. 11 is a schematic cross-sectional view illustrating another aspect of gate electrodes in a conventional semiconductor device.

On the other hand, in the semiconductor device described in Japanese Laid-open patent publication NO. 2004-356520, the first gate electrode 126 and the second gate electrode 130 are formed to have the same gate length and only the grain sizes of the poly-silicon grains thereof are controlled. Accordingly, as illustrated in FIG. 11, the gate length may become significantly great relative to the grain size of the poly-silicon grains 140. In this case, there are complicated and longer impurity-diffusion paths within the gate electrodes. Accordingly, there are paths along which impurities can not diffuse to the proximity of the gate insulating film, which tends to cause depletion within the second gate electrode 130 during application of a gate voltage. This may result in degradation of the electric characteristics of the first gate electrode 126.

On the contrary, the gate length may become small relative to the grain size of the poly-silicon grains 136 (FIG. 10A). In this case, there is induced partial absence of impurity diffusion paths in the first gate electrode 126 or variations of the number of impurity diffusion paths therein. This causes variations of the impurity diffusion concentration in the first gate electrode 126, which may cause partial depletion therein, thus resulting in degradation of the electric characteristics of the first transistor 110.

As described above, there have been cases where the electric characteristics of transistors are degraded, even when the grain sizes of the poly-silicon grains forming the gate electrodes are controlled.

Under the circumstances, the present inventors have found from earnest studies that, when the first gate length L1 of the first electrode 26 is greater than the second gate length L2 of the second gate electrode 30, the grain size of the poly-silicon grains forming the first gate electrode 26 can be made greater than the grain size of the poly-silicon grains forming the second gate electrode 30 to stabilize the electric characteristics of the gate electrodes. Namely, they have found that the aforementioned configuration of gate electrodes can optimize the number of poly-silicon grains for the gate lengths of the gate electrodes, which can optimize the number of impurity diffusion paths. More specifically, in the first gate electrode 26, as illustrated in FIG. 4A, the number of impurity diffusion paths within the first gate electrode 26 can be optimized, which can facilitate the diffusion of impurities, thereby preventing the occurrence of depletion. Further, in the second gate electrode 30 as illustrated in FIG. 4B, it is possible to secure impurity diffusion paths within the second gate electrode 30, which can alleviate the variation of the impurity concentration therein, thereby preventing the occurrence of local depletion.

In the case of N-type MOSFETs, such degradation of the electric characteristics of the transistors due to depletion in the gate electrodes may be prominent. However, the first transistor 10 including the first gate electrode 26 and the second transistor 12 including the second gate electrode 20 are can be employed as N-type MOSFETs, as in the present embodiment, to prevent the aforementioned problem.

Such gate electrodes made of poly-silicon grains having grain sizes which are varied depending on their gate lengths can not be formed by only doping impurities therein and subsequently applying heat treatment thereto as in normal fabricating methods. It is important to preferably set the condition of heat treatment.

Hereinafter, there will be described a method of fabricating the semiconductor device 1 according to the present embodiment.

More specifically, an insulating film is formed on a semiconductor substrate 5 and then a silicon film is formed on the insulating film through a thermal CVD method or the like. The thermal CVD method is performed by using silane ($SiH_4$) gas, at a temperature in the range of about 550° C. to 600° C., to form a film made of an amorphous silicon. Also, the thermal CVD method may be performed at a temperature in the range of about 600° C. to 650° C. to form a film made of a poly-silicon. After the deposition of the silicon film, a conventional lithography process is applied thereto, using a resist film which has been patterned into a predetermined shape, to form a configuration consisting of a gate insulating film and a silicon layer which are stacked. More specifically, as illustrated in FIG. 2, the silicon layer is etched so as to obtain a first gate electrode 26 having a first gate length L1 and a second gate electrode 30 having a second gate length L2. After the etching process, ramp annealing is applied thereto at a temperature of about 1000° C., for 10 seconds, in an atmosphere of nitrogen. Thereafter, predetermined impurities are doped into the silicon film with a conventional method to form the first gate electrode 26 and the second gate electrode 30.

By controlling the gate lengths of gate electrodes and applying annealing thereto under a predetermined condition for forming the gate electrodes as describe above, it is possible to provide gate electrodes made of poly-silicon grains having grain sizes which are varied depending on their gate lengths.

On the other hand, in the case of the semiconductor device described in Japanese Laid-open patent publication NO. 2004-356520, it is necessary to form an amorphous silicon layer on a semiconductor substrate and then implant silicon ions and the like into the amorphous silicon layer at the side on which the first gate electrode is to be formed. This can delay the solid-phase growth starting time of the amorphous silicon layer during a subsequent annealing process to form poly-silicon grains having a greater grain size, as described therein. However, it is extremely difficult to control the grain size of poly-silicon grains with the amount of implanted silicon ions and the like, which has induced the problem of the necessity of additional processes.

On the contrary, the grain sizes of the poly-silicon grains of the first gate electrode and the second gate electrode can be adjusted depending on their gate lengths in a self-aligning manner by employing predetermined annealing conditions. Namely, the grain sizes of the poly-silicon grains can be adjusted only by varying the gate lengths. This can eliminate the necessity of increasing the number of processes for fabricating the semiconductor device.

Figure 5:
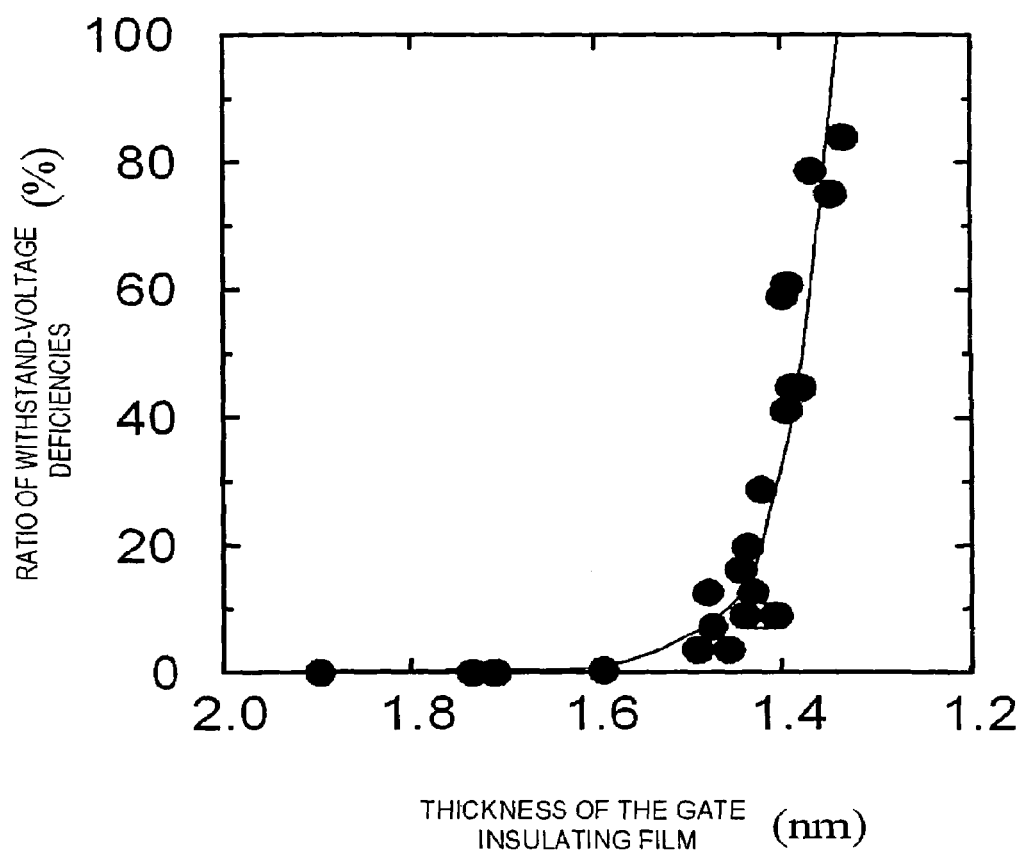
FIG. 5 is a graph illustrating the relationship between "the thickness of the gate insulating film" and "the ratio of withstand-voltage deficiencies" of N-type MOSFETs.

Although the semiconductor device according to the present embodiment can offer the aforementioned effects, if the thickness of the gate insulating film is equal to or less than 2 nm, this will cause significant degradation of the withstand voltage of the gate insulating film. FIG. 5 is a graph illustrating the relationship between "the thickness of the gate insulating film" and "the ratio of withstand-voltage deficiencies" of N-type MOSFETs. The gate length of their gate electrodes was set to 1.0 µm and the gate width thereof was set to 1000 µm. As can be seen from FIG. 5, when the gate insulating film had a thickness of 2 nm or less, particularly 1.6 nm or less, the ratio of withstand-voltage deficiencies was increased. The present inventors have found from further detailed studies that, with increasing gate lengths of gate electrodes, the withstand voltages of their gate insulating films are decreased and the ratio of defective transistors is increased.

Therefore, the present inventors have found from further earnest studies that the ratio of withstand-voltage deficiencies can be reduced and the ratio of defective transistors can be reduced by forming the first transistor 10 and the second transistor 12 such that the first gate length L1 and the gate width W1 of the first gate electrode 26 and the second gate length L2 and the gate width W2 of the second gate electrode 30 satisfy predetermined conditions.

Namely, the semiconductor device 1 is configured such that the first gate length L1 and the gate width W1 of the first gate electrode 26 and the second gate length L2 and the gate width W2 of the second gate electrode 30 satisfy any of the following conditions (a) to (c).

(a) the gate length: less than 0.1 µm, (b) the gate length: in the range of from 0.1 µm or more to less than 0.2 µm, and the gate width: 10000 µm or less, (c) the gate length: 0.2 µm or more, and the gate width: 1000 µm or less By forming the first gate electrode 26 and the second gate electrode 30 such that the aforementioned conditions are satisfied, it is possible to reduce the ratio of defective transistors, thereby offering a reliable semiconductor device.

Also, it is possible to configure a semiconductor device 1 having plural transistors including a first transistor 10 and a second transistor 12 such that the two gate electrodes constituting arbitrary two transistors selected out of the plural transistors satisfy any of the aforementioned conditions (a) to (c). Also, it is possible to configure the semiconductor device 1 such that all of the plural transistors satisfy any of the aforementioned conditions (a) to (c). By configuring the semiconductor device 1 as described above, it is possible to reduce the ratio of defective transistors, thereby providing a reliable semiconductor device.

Figure 6:
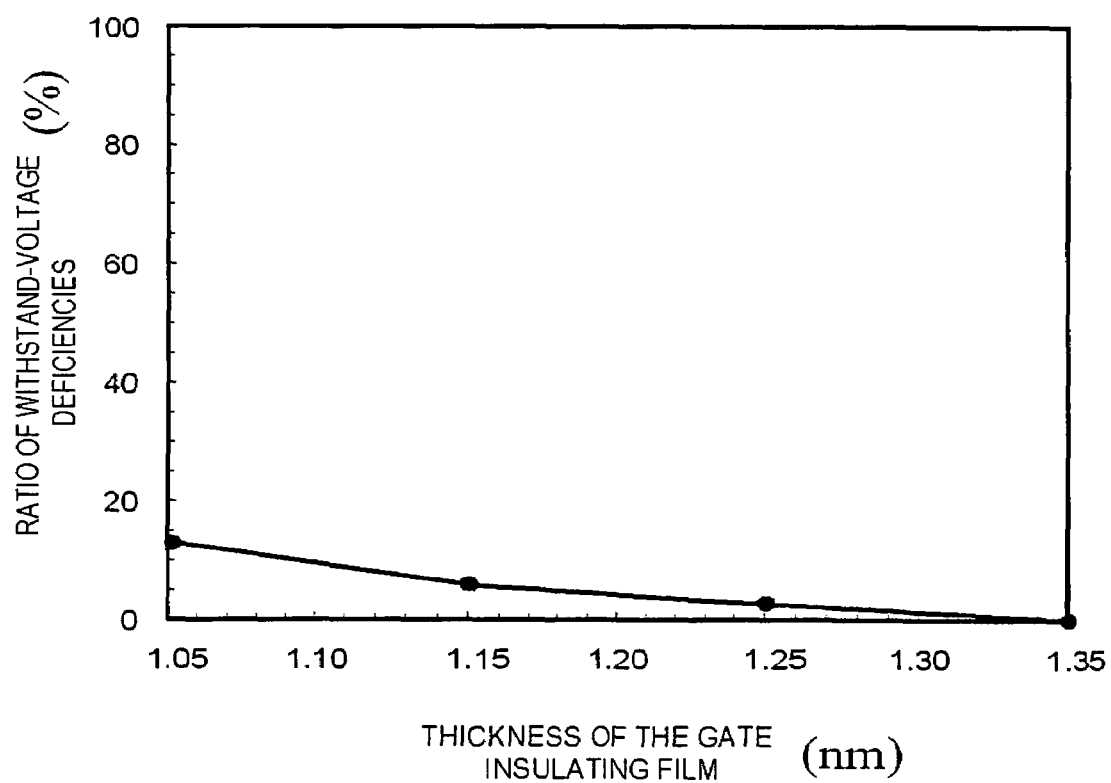
FIG. 6 is a graph illustrating the relationship between "the thickness of the gate insulating film" and "the ratio of withstand-voltage deficiencies" of N-type MOSFETs.

Further, in the semiconductor device, if the thickness of the gate insulating film is smaller than 1 nm, this will cause significant degradation of the withstand voltage of the gate insulating film, which may prevent the effects of the restricted gate width from becoming evident. FIG. 6 illustrates cases where the gate lengths of gate electrodes are set to 0.05 µm and the gate widths thereof are set to 1000 µm, in N-type MOSFETS in semiconductor devices. As can be seen from FIG. 6, the ratio of withstand-voltage deficiencies is increased with decreasing in the thickness of the gate insulating film and, particularly, if the thickness of the gate insulating film is smaller than 1 nm (not shown), the withstand voltage of the gate insulating film is significantly degraded. Accordingly, the lower limit of the thickness of the gate insulating film is 1 nm.

While there has been described an embodiment of the present invention with reference to the drawings, the embodiment is merely illustrative and various configurations other than the aforementioned configuration can be employed.

For example, the analog circuit 2 may include a device region including a second transistor 12 and the digital circuits 3 and 4 may include a device region including a first transistor. Also, the analog circuit 2 may include a device region including a first transistor 10 and a second transistor 12 and the digital circuits 3 and 4 may include a device region including a first transistor 10 and a second transistor 12.

Further, the semiconductor device 1 may include a single analog circuit and two digital circuits or may include plural analog circuits and plural digital circuits. In any of the cases, it is necessary only that any of the circuits includes a first transistor and a second transistor.

It is not necessary that a first transistor 10 and a second transistor 12 are adjacent to each other. Also, first transistors 10 may be adjacent to each other or second transistors 12 may be adjacent to each other or another transistor may be formed between a first transistor 10 and a second transistor 12.

For example, when the first gate length L1 of the first gate electrode 26 is in the range of 0.1 to 0.2 μm, it is preferable that the grain size of the poly-silicon grains 36 is set to be in the range of 30 to 80 nm. Further, when the second gate length L2 of the second gate electrode 30 is in the range of 0.05 to 0.1 μm, it is preferable that the grain size of the poly-silicon grains 38 is set to be in the range of 10 to 30 nm.

EXAMPLES

Hereinafter, the present invention will be concretely described with reference to exemplary experiments. However, the present invention is not limited to these exemplary experiments.

First Exemplary Experiment

A semiconductor device 1 according to an embodiment was fabricated under the following conditions.

First, a $SiO_2$ film was formed, through a thermal oxidation method, on the surface of a semiconductor substrate 5 including a device isolation layer 14 formed therein. Next, a poly-silicon film was deposited on the $SiO_2$ film, through a thermal CVD method or the like. The thermal CVD method was performed using silane ($SiH_4$) gas, at a temperature of about 625° C. After the deposition of the poly-silicon film, a lithography process was applied thereto, using a resist film patterned into a predetermined shape, to form a configuration consisting of a gate insulating film and a silicon layer which were stacked. The silicon layer was etched so as to obtain a first gate electrode 26 having a first gate length L1 and a second gate electrode 30 having a second gate length L2.

Next, ramp annealing was applied thereto at a temperature of about 1000° C., for 10 seconds, in an atmosphere of nitrogen. Thereafter, impurities were doped therein to form the first gate electrode 26 and the second gate electrode 30. The first gate electrode 26 had a gate length of 170 nm and the second gate electrode 30 had a gate length of 70 nm. Then, side walls 28 and 34 made of $SiO_2$ were formed on the sidewalls of the first gate electrode 26 and the second gate electrode 30. Further, a pair of impurity diffusion layers 18 and 22 were formed near the surface of the semiconductor substrate 5 at the both sides of the side walls 28 and 34, respectively. With the aforementioned fabricating method, the semiconductor device 1 was formed.

Figure 7A:
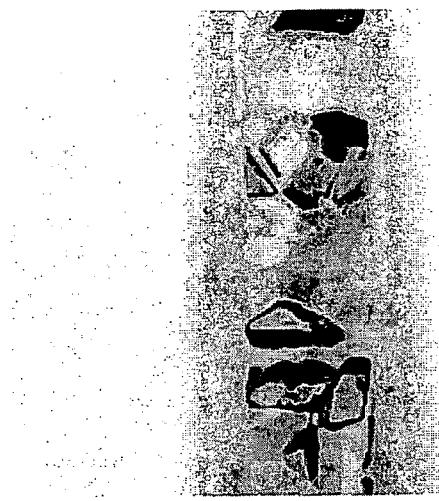
FIGS. 7A and 7B are views illustrating the results of observation of the upper surfaces of the first and second gate electrodes in a semiconductor device obtained in an example.
Figure 7B:
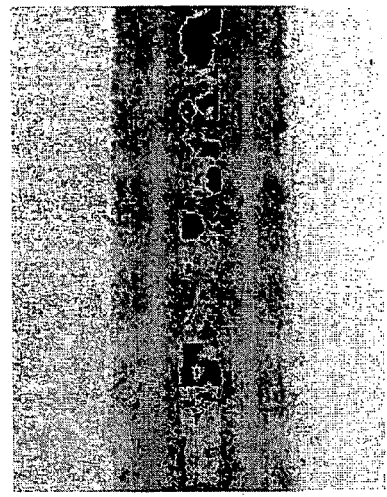

The first gate electrode 26 and the second gate electrode 30 in the semiconductor device 1 were observed with TEM. FIGS. 7A and 7B illustrate views illustrating the results of the observation of the gate electrodes from their upper surfaces. FIG. 7A illustrates a view of the first gate electrode 26 (having a gate length of 170 nm) and FIG. 7B illustrates a view of the second gate electrode 30 (having a gate length of 70 nm). As can be seen from FIGS. 7A and 7B, the poly-silicon of the first gate electrode 26 had a grain size larger than the grain size of the poly-silicon of the second gate electrode 30.

Second Exemplary Experiment

Figure 8:
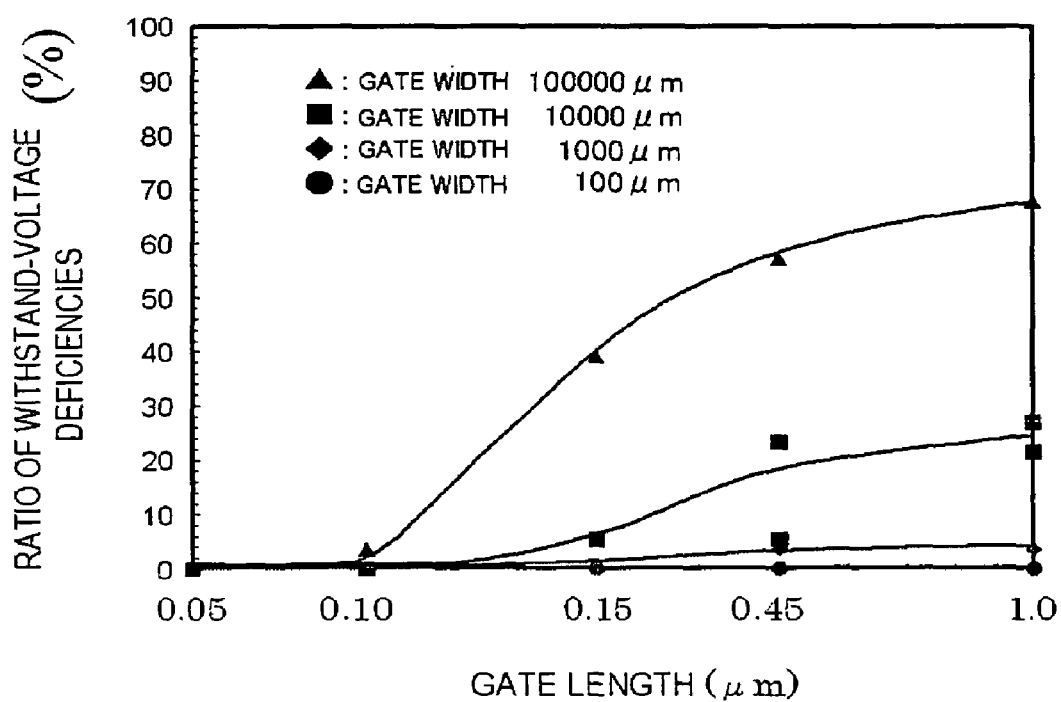
FIG. 8 is a graph illustrating the relationship between "the gate lengths and the gate widths of the gate electrodes" and "the ratio of withstand-voltage deficiencies" in a semiconductor device obtained in an example.
Figure 9:
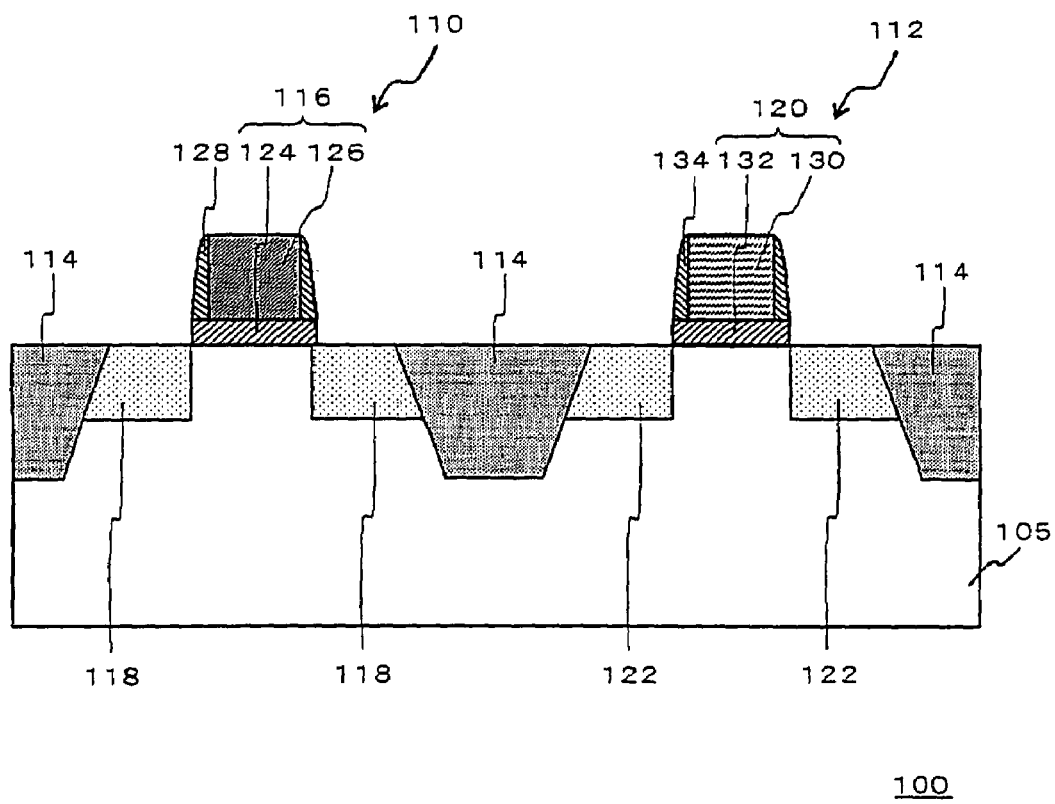
FIG. 9 is a partial cross-sectional view of a conventional semiconductor device.

In transistors formed in a semiconductor device 1, the gate length of the gate electrodes were set to 0.10 μm, 0.15 μm, 0.45 μm, and 1 μm. For the respective gate lengths, the gate widths were set to $1\times10^2$ μm, $1\times10^3$ μm, $1\times10^4$ μm and $1\times10^5$ μm. Under the aforementioned conditions, the ratio of occurrences of transistor withstand-voltage deficiencies was inspected. The thickness of the gate insulating film was set to 1.5 nm. FIG. 8 illustrates the result.

As illustrated in FIG. 8, when the gate lengths and the gate widths of the gate electrodes constituting the transistors satisfies any of the following conditions (a) to (c), the ratio of transistors generating initial defects was lower than 10%, thereby obtaining reliable semiconductor devices.

(a) the gate length: less than 0.1 μm,
(b) the gate length: in the range of from 0.1 μm or more to less than 0.2 μm, and the gate width: 10000 μm or less,
(c) the gate length: 0.2 μm or more, and the gate width: 1000 μm or less It is apparent that the present invention is not limited to the above embodiment, that may be modified and changed without departing from the scope and spirit of the invention.

What is claimed is:

1. A semiconductor device comprising:
   a semiconductor substrate;
   a first transistor formed on said semiconductor substrate, said first transistor including a first gate electrode portion comprising a first gate insulating film and a first gate electrode having a first gate length, the first gate insulating film and the first gate electrode being stacked; and
   a second transistor formed on said semiconductor substrate, said second transistor including a second gate electrode portion comprising a second gate insulating film and a second gate electrode having a second gate length smaller than said first gate length, the second gate insulating film and the second gate electrode being stacked;
   wherein the grain size of poly-silicon grains forming said first gate electrode is greater than the grain size of poly-silicon grains forming said second gate electrode, and
   wherein the thickness of said first gate insulating film is substantially equal to the thickness of said second gate insulating film.

2. The semiconductor device according to claim 1, wherein the gate width of said second gate electrode has a predefined value or less which is restricted depending on its respective gate length.

3. The semiconductor device according to claim 2,
   wherein said first gate electrode and said second gate electrode satisfy any of the following conditions (a) to (b);
   (a) the gate length: in the range of from 0.1 μm or more to less than 0.2 μm, and the gate width: 10000 μm or less,
   (b) the gate length: 0.2 μm or more, and the gate width: 1000 μm or less.

4. The semiconductor device according to claim 2,
   wherein plural transistors including said first transistor and said second transistor are formed on said semiconductor substrate and the two gate electrodes constituting arbitrary two transistors selected out of said plural transistors satisfy any of the following conditions (a) to (b);
   (a) the gate length: in the range of from 0.1 μm or more to less than 0.2 μm, and the gate width: 10000 μm or less,
   (b) the gate length: 0.2 μm or more, and the gate width: 1000 μm or less.

5. The semiconductor device according to claim 4,
   wherein all of said plural transistors satisfy said condition (a) or (b).

6. The semiconductor device according to claim 2, wherein said first gate insulating film and said second gate insulating film have thicknesses of 2 nm or less.

7. The semiconductor device according to claim 2, wherein said first gate insulating film and said second gate insulating film have thicknesses of 1.6 nm or less.

8. The semiconductor device according to claim 1, wherein said first transistor and said second transistor are N-type MOSFETs.

9. The semiconductor device according to claim 1, wherein said semiconductor substrate includes an impurity diffusion layer and a device isolation layer in the surface layer, the upper surface of said impurity diffusion layer and the upper surface of said device isolation layer substantially exist on same level surface.

* * * * *